(12) United States Patent
Lîn

(10) Patent No.: US 6,373,105 B1
(45) Date of Patent: Apr. 16, 2002

(54) LATCH-UP PROTECTION CIRCUIT FOR INTEGRATED CIRCUITS BIASED WITH MULTIPLE POWER SUPPLIES

(75) Inventor: Shí-Tron Lîn, Taipei (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/535,568

(22) Filed: Mar. 27, 2000

(30) Foreign Application Priority Data

Oct. 16, 1999 (TW) .......................................... 88117914

(51) Int. Cl.$^7$ ............................................... H01L 23/62
(52) U.S. Cl. ........................ 257/357; 257/358; 257/360; 257/361
(58) Field of Search ................................. 257/357, 358, 257/359, 360, 361, 363

(56) References Cited

U.S. PATENT DOCUMENTS 5,760,446 A * 6/1998 Yang et al. .................. 257/357
6,246,079 B1 * 6/2001 Chen ........................... 257/173
6,268,992 B1 * 7/2001 Lee et al. ..................... 361/111

\* cited by examiner

*Primary Examiner*—Ngân V. Ngô
(74) *Attorney, Agent, or Firm*—Fish & Richardson P.C.

(57) ABSTRACT

A latch-up protection circuit is integrated with a CMOS circuitry, which is powered by a first voltage and a second voltage via a first power rail and a second power rail, respectively, on a semiconductor substrate. The latch-up protection circuit of the present invention comprises: a well of a first conductivity type, a first diffusion region of the first conductivity type, a second diffusion region of a second conductivity type, and a third diffusion region of the second conductivity type. The well is formed in the semiconductor substrate to establish a junction therebetween. The first diffusion region is formed in the well and connected to the first power rail. The second diffusion region is formed in the well and connected to the second power rail, where the second diffusion region is spaced from the junction by a first spacing. The third diffusion region is formed in the well and connected to a third power rail, where the third diffusion region is spaced from the second diffusion region by a second spacing smaller than the first spacing.

41 Claims, 7 Drawing Sheets

LATCH-UP PROTECTION CIRCUIT FOR INTEGRATED CIRCUITS BIASED WITH MULTIPLE POWER SUPPLIES

BACKGROUND OF THE INVENTION

1. Field of the Invention

The present invention generally relates to integrated circuit technologies. More particularly, the present invention relates to a latch-up protection circuit for integrated circuits biased with multiple power supplies.

2. Description of the Related Art

Due to different voltage requirements of different integrated circuit (IC) generations, an IC chip may be powered by multiple power supplies at different voltage levels in consideration of multipurpose and compatibility. For example, the IC chip may have input/output circuitry to be powered by a voltage source of 5V while employing another voltage source of 3.3V to drive internal circuitry, such as memory cells and sense amplifiers.

As shown FIG. 1, a conventional CMOS circuit of an IC chip with multiple power supplies is schematically illustrated in a cross-sectional view. In the drawing, the conventional CMOS circuit is fabricated onto a p-type semiconductor substrate 10 in which an n-type well 20 is provided. The CMOS circuit is composed of a pMOS transistor and an nMOS transistor. The nMOS transistor includes two spaced-apart diffusion regions 12D and 12S as its drain and source, respectively, and a gate 14 overlying a portion of the p-type semiconductor substrate 10 therebetween. The pMOS transistor includes two spaced-apart diffusion regions 22D and 22S as its drain and source, respectively, and a gate 24 overlying a portion of the n-type well 20 therebetween.

Typically, the n-type well 20 is biased via a $V_{DDH}$ power rail. As shown in FIG. 1, the n-type well 20 is electrically connected to the $V_{DDH}$ power rail by an $n^+$-type contact region 26. The p-type substrate 10 is electrically connected to a $V_{SS}$ power rail or a ground rail by a $p^+$-type contact region 16. Because the IC chip is powered by anther power supply $V_{DDL}$ with a full level lower than that of the power supply $V_{DDH}$, the pMOS transistor is configured with its source 22S connected to the $V_{DDL}$ power rail in order to ensure that the junction between the source 22S and the n-type well 20 keeps reverse-biased without causing leakage current.

However, in a CMOS circuit with multiple power supplies, those power supplies may reach their full levels at the different time after the IC chip is powered on. In a non-desirable power-on sequence, the power supply $V_{DDL}$ is established at the $V_{DDL}$ power rail sooner than the power supply $V_{DDH}$ does at the $V_{DDH}$ power rail. Thus, as shown in FIG. 2, a time interval T exists in which the potential of the $V_{DDL}$ power rail is temporarily greater than that of the $V_{DDH}$ power rail. Under these circumstances, the junction between the $p^+$-type diffusion region 22S and the n-type well 20 is momentarily forward biased. Therefore, large current is conducted to flow through the n-type well 20 toward the $n^+$-type contact region 26 so that a lateral semiconductor controlled rectifier, constituted by the $p^+$-type diffusion region 22S, the n-type well 20, the p-type substrate 10, and the $n^+$-type diffusion region 12S, may be triggered to latch-up.

Conventional approach employs a guard ring around the CMOS circuit to collect additional carriers and thus suppress latch-up. However, because there are numbers of the CMOS circuits biased with multiple power supplies to be integrated in the IC chip, the fact that each CMOS circuit should be enclosed by the associated guard ring takes up a great amount of precious chip area.

Alternatively, U.S. Pat. No. 4,871,927 employs an MOSFET to clamp the well potential within one relative threshold voltage from the source potential. However, this method is less efficient as the diffusion/well diode may also turn on at about the same time to inject carriers into the well and eventually causes latch-up in the CMOS circuit.

SUMMARY OF THE INVENTION

Therefore, it is an object of the present invention to provide a latch-up protection circuit for integrated circuits biased with multiple power supplies to prevent the CMOS circuitry from latch-up damage during a non-desirable power-on sequence.

For achieving the aforementioned object, the present invention provides a latch-up protection circuit integrated with a CMOS circuitry on a semiconductor substrate. The CMOS circuitry is powered by a first voltage and a second voltage via a first power rail and a second power rail, respectively. The latch-up protection circuit of the present invention comprises: a well of a first conductivity type, a first diffusion region of the first conductivity type, a second diffusion region of a second conductivity type, and a third diffusion region of the second conductivity type. The well is formed in the semiconductor substrate to establish a junction therebetween. The first diffusion region is formed in the well and connected to the first power rail. The second diffusion region is formed in the well and connected to the second power rail, where the second diffusion region is spaced from the junction by a first spacing. The third diffusion region is formed in the well and connected to a third power rail, where the third diffusion region is spaced from the second diffusion region by a second spacing smaller than the first spacing. Note that the third power rail can be a $V_{SS}$ power rail, a ground rail, or a power rail of other potential.

Accordingly, full levels at the first power rail and the second power rail can ensure that no latch-up triggering path exists in the CMOS circuitry during steady state (without external triggering source). However, a current is generated between the second diffusion region and the third diffusion region to reduce a potential difference between the first power rail and the second power rail when the first power rail has a temporary potential within those of the second power rail and the third power rail during a power-on sequence. Furthermore, There is a lateral bipolar junction transistor constituted with the well, the second diffusion region and the third diffusion region as its base, emitter and collector. The lateral BJT sinks the current provided by the second power rail if the potential of the first power rail is temporary within those of the second power rail and the third power rail. Therefore, the voltage rising of the first power rail is reduced to prevent latch-up event happening in the CMOS circuitry. Thus, the CMOS circuitry is protected without suffering from latch-up damage.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

The present invention solves the latch-up issue caused by the power supply $V_{DDH}$ arriving later than the power supply $V_{DDL}$ at a CMOS IC chip. According to the present invention, a lateral bipolar junction transistor is utilized to sink large current from the $V_{DDL}$ power rail and localize a well current generated in a non-desirable power-on sequence. Thus, the potential difference between the $V_{DDL}$ power rail and the $V_{DDH}$ power rail during the non-desirable power-on sequence can be decreased so as to slow down the voltage rising of the power supply $V_{DDL}$ and thus suppress latch-up.

First Embodiment

Figure 3:
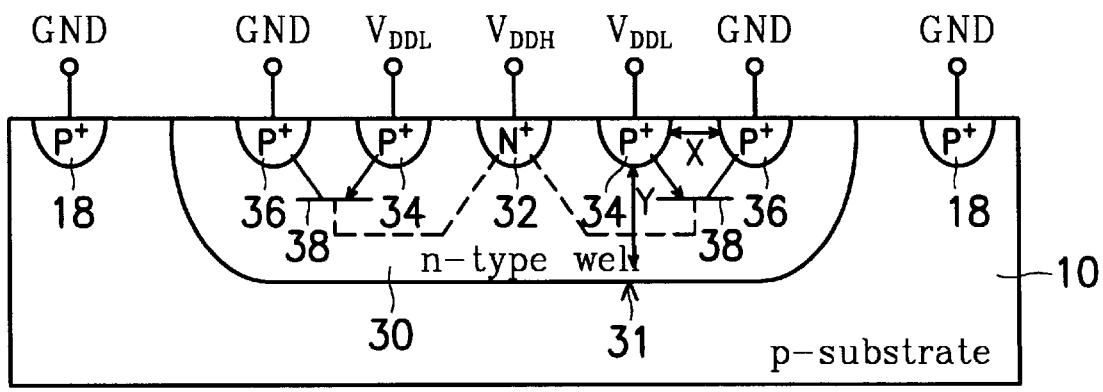
FIG. 3 schematically illustrates the first preferred embodiment of the present invention fabricated onto a semiconductor substrate in a cross-sectional view.

Referring to FIG. 3, a latch-up protection circuit in accordance with the first preferred embodiment of the present invention fabricated onto the semiconductor substrate 10 is schematically illustrated. In this embodiment, p-substrate/n-well is exemplified, that is, the semiconductor substrate 10 is a p-type substrate in which an n-type well 30 is provided so that a p/n junction 31 is established therebetween. The latch-up protection circuit of present invention is formed in the n-type well 30, which can be formed at the same process steps and has substantially the same junction depth as the n-type well 20 of FIG. 1 does.

In FIG. 3, the n-type well 30 is provided with an n$^+$-type diffusion region 32, a first p$^+$-type diffusion region 34 and a second p$^+$-type diffusion region 36. The first p$^+$-type diffusion region 34 is deposed between the n$^+$-type diffusion region 32 and the second p$^+$-type diffusion region 36. The n$^+$-type diffusion region 32 serves as a contact region for the n-type well 30. The first p$^+$-type diffusion region 34 is spaced from the second p$^+$-type diffusion region 36 by a spacing X, and spaced from the junction 31 by a spacing Y. Accordingly, the first p$^+$-type diffusion region 34, the n-type well 30 and the second p$^+$-type diffusion region 36 constitute a lateral bipolar junction transistor 38 being an emitter, a base and a collector, respectively.

The n$^+$-type diffusion region 32 is connected to the $V_{DDH}$ power rail, the first p$^+$-type diffusion region 34 is connected to the $V_{DDL}$ power rail, and the second p$^+$-type diffusion region 36 is connected to a $V_{SS}$ power rail or a ground rail GND. Under cicuit operation, that is, the power supplies $V_{DDH}$ and $V_{DDL}$ are established at their full levels, such as a combination of 12V/5V, 5V/3.3V, or 3.3V/2.5V. In the following, the combination of 5V/3.3V is exemplified as the power supplies $V_{DDH}$/$V_{DDL}$ are full-level established at the $V_{DDH}$ and $V_{DDL}$ power rails, respectively, for detailed description.

If the power supply $V_{DDH}$ after powering on, comes in slower than the power supply $V_{DDL}$ so that $V_{DDH}$<$V_{DDL}$ momentarily, results in a non-desirable power-on sequence. According to the latch-up protection circuit of the present invention, because the p$^+$-type diffusion region 34 is connected to the $V_{DDL}$ power rail and the n$^+$-type diffusion region 32 is connected to the $V_{DDH}$ power rail, the diode formed by the p$^+$-type diffusion region 34 and the n-type well 30 enter forward bias and thus pull up the potential of the n-type well 30 higher than that at the $V_{DDH}$ power rail. As a result, large current flowing through the n-type well 30 charges up the $V_{DDH}$ power rail to decrease the potential difference between the $V_{DDH}$ power rail and the $V_{DDL}$ power rail.

As mentioned above, the current flowing through the n-type well 20 is disastrous for triggering CMOS latch-up. Accoding to the present invention, the latch-up protection circuit is integrated with the CMOS circuitry of FIG. 1 on the semiconductor substrate 10. Therefore, the lateral bipolar junction transistor 38 is used to cause a emitter-to-collector current from the $V_{DDL}$ power rail to the ground rail GND (or $V_{SS}$ power rail) and thus locally confine the well current. In other words, the lateral bipolar junction transistor 38 acts as a current-sinking device bypassing the current from $V_{DDl}$ power rail, through the n-type well 30, to the second p$^+$-type diffusion region 36 so as to slow down the voltage-rising of the power supply $V_{DDL}$ at the $V_{DDL}$ power rail.

Moreover, the lateral bipolar junction transistor 38 is provided with the n-type well 30 as its base so that the spacing X between the first p$^+$-type diffusion region 34 and the second p$^+$-type diffusion region 36 represents the base width thereof. For ensuring that the holes injected from the first p$^+$-type diffusion region 34 into the n-type well 30 is mostly collected by the second p$^+$-type diffusion region 36, the spacing X should be smaller than the spacing Y by which the first p$^+$-type diffusion region 34 is spaced apart from the p/n junction 31, that is, X<Y. Preferably, X<0.6Y. More preferably, X<0.3Y. In addition, the spacing X should conform with the design rule. In other words, the spacing X can be equal to the minimum feature size L defined by the design rule, or slightly greater than the minimum feature size L, such as X≦2L.

Figure 1:
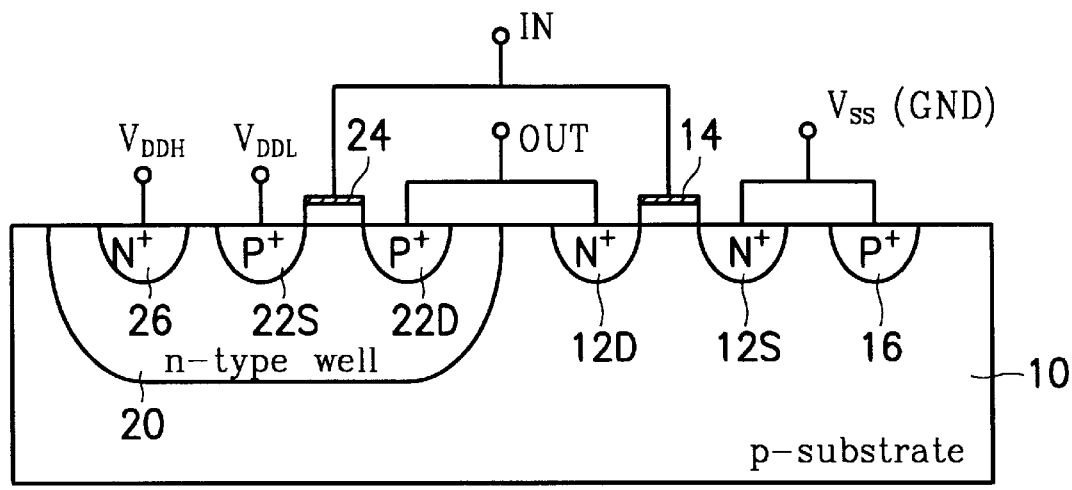
FIG. 1 schematically illustrates a conventional CMOS circuit of an IC chip with multiple power supplies in a cross-sectional view.
Figure 2:
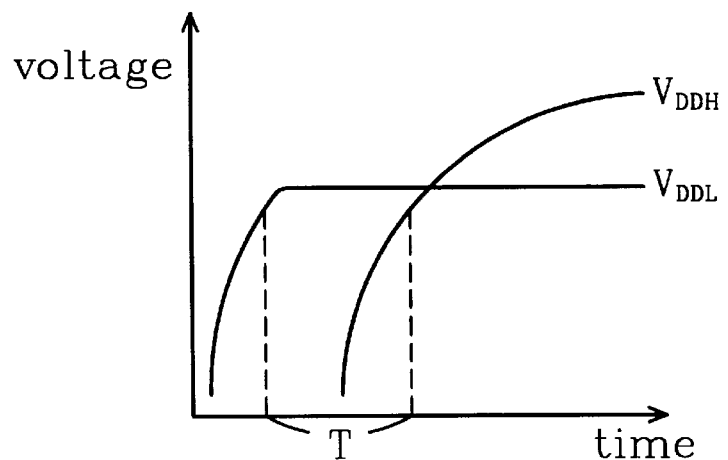
FIG. 2 a diagram illustrating that the power supply $V_{DDL}$ is established at a $V_{DDL}$ power rail sooner than the power supply $V_{DDH}$ at a $V_{DDH}$ power rail does in a non-desirable power-on sequence.

In addition, a p$^+$-type guard ring 18 can be formed in the p-type substrate 10 and deposed between the n-type well 30 and the CMOS circuitry of FIG. 1. Even though a small portion of injected holes passes through the p/n junction 31, the carriers can be absorbed by the guard ring 18 to keep it away from the CMOS circuit and further suppress the CMOS latch-up.

Figure 4:
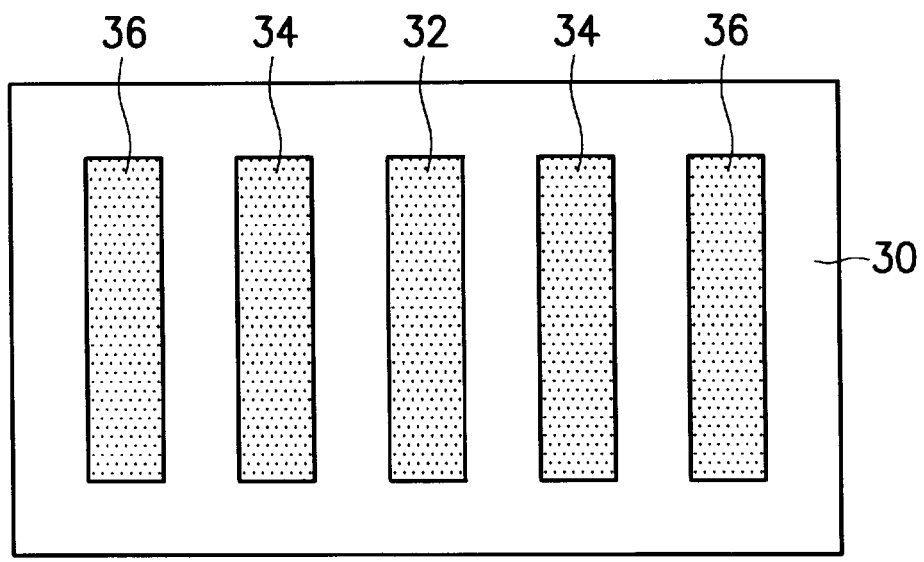
FIG. 4 schematically illustrates one layout diagram of FIG. 3 in a top view.
Figure 5:
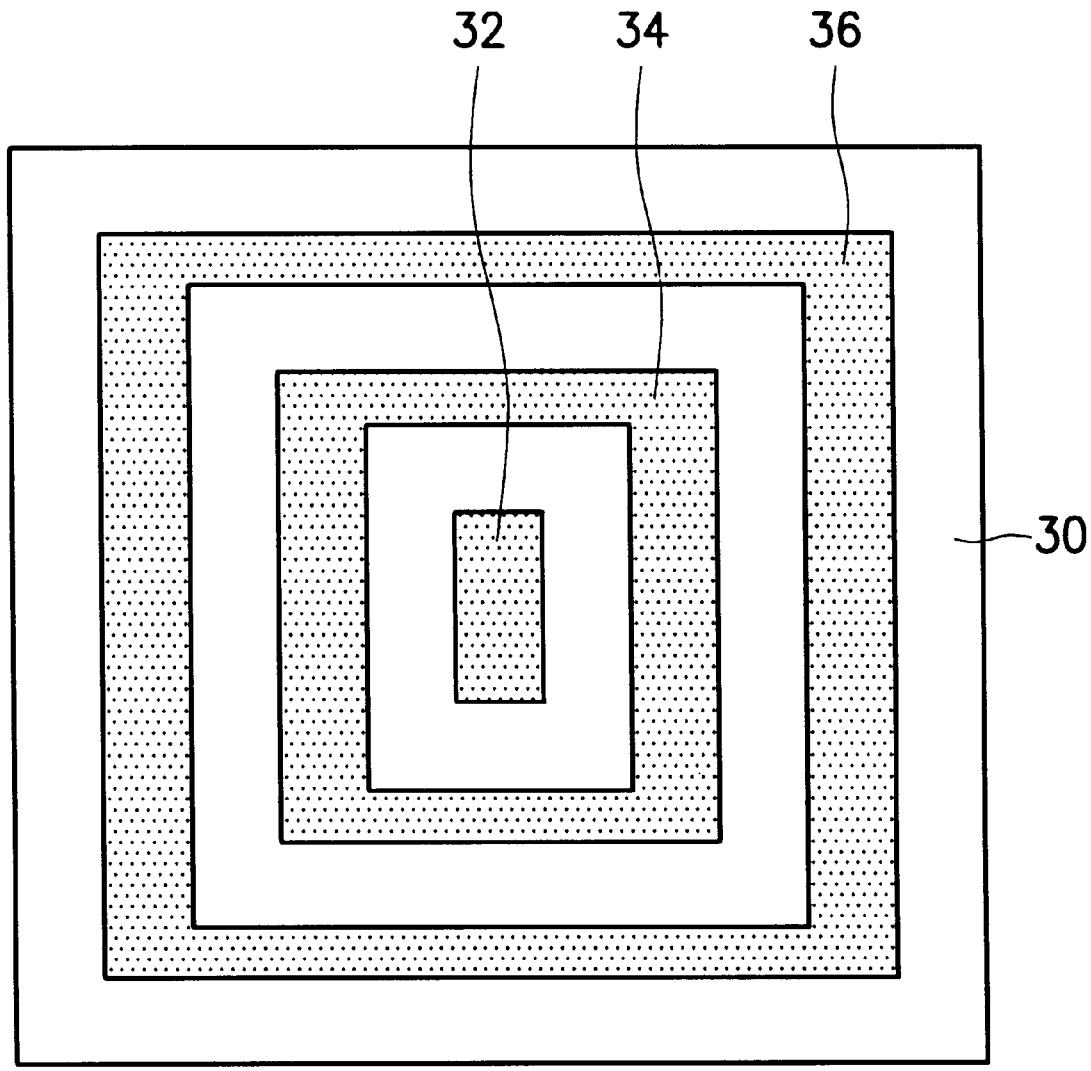
FIG. 5 schematically illustrates another layout diagram of FIG. 3 in a top view.

FIG. 4 illustrates one layout example of FIG. 3 in a top view, in which the p$^+$-type diffusion regions 34 and 36 are in the shape of plural strips. Fo example, two p$^+$-type diffusion regions 34 and two p$^+$-type diffusion regions 36 are formed in the n-type well 30 in symmetry with the n$^+$-type diffusion region 32. Alternatively, FIG. 5 illustrates another layout example of FIG. 3 in a top view, in which the p$^+$-type diffusion regions 34 and 36 are arranged in ring shapes and formed in the n-type well 30 in symmetry with the n$^+$-type diffusion region 32.

Second Embodiment

Figure 6:
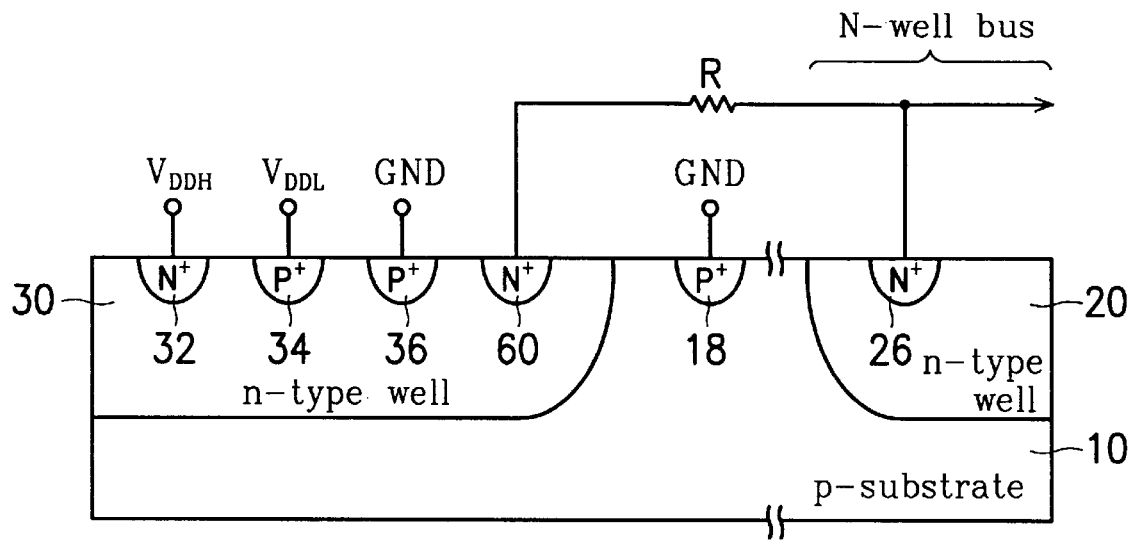
FIG. 6 schematically illustrates the second preferred embodiment of the present invention fabricated onto a semiconductor substrate in a cross-sectional view.

Referring to FIG. 6, the second preferred embodiment of the present invention fabricated onto a semiconductor substrate 10 is schematically illustrated in a cross-sectional view. In this embodiment, an n$^+$-type diffusion region 60 is further provided in the n-type well 30. Preferably, the n$^+$-type diffusion region 60 electrically couples to other well regions, such as electrically connected to the n$^+$-type contact region 26 of of an n-well 20 for a CMOS circuit and other n$^+$-type contact region in other n-wells, by a resistor R, instead of the n$^+$-type contact region 26 directly connecting with the V$_{DDH}$ power rail as shown in FIG. 1.

In the non-desirable power-on sequence, that is, V$_{DDH}$<V$_{DDL}$, momentarily, the V$_{DDL}$ power rail pulls up the potential of the n-type well 30 through the p$^+$-type diffusion region 34, and the lateral bipolar junction transistor 38 is turned on to cause an emitter-to-collector current from the V$_{DDL}$ power rail to the V$_{SS}$ power rail to slow down the voltage-rising of the power supply V$_{DDL}$ at the V$_{DDL}$ power rail. Moreover, due to the current limit of the resistor R, most current flowing through the n-type well 30 is further confined locally without flowing through all over the IC chip to avoid latch-up issue.

The optimized resistance of the resistor R depends on the voltage rising rate at the V$_{DDL}$ power rail. Typically, the resistance can be in the order of 10 ohms to a few hundred ohms. The resistor R can be a well resistor, polysilicon resistor, and other resistor compatible with the integrated circuit fabrication.

Third Embodiment

Figure 7:
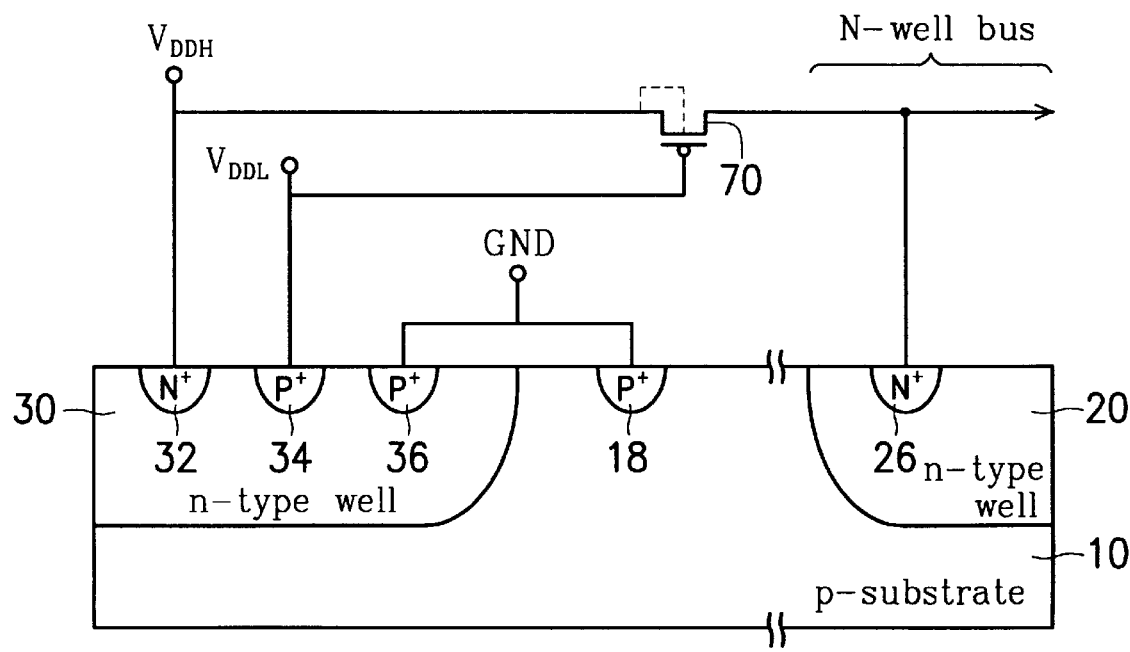
FIG. 7 schematically illustrates the third preferred embodiment of the present invention fabricated onto a semiconductor substrate in a cross-sectional view.

Referring to FIG. 7, the third preferred embodiment of the present invention fabricated onto a semiconductor substrate 10 is schematically illustrated in a cross-sectional view. In this case, the latch-up protection circuit further has a pMOS transistor 70 configured with a gate connected to the V$_{DDL}$ power rail, one source/drain connected to the V$_{DDH}$ power rail, and another source/drain connected to the contact region 26 of the CMOS circuitry.

Accordingly, in the non-desirable power-on sequence, that is, V$_{DDH}$<V$_{DDL}$ momentarily, the V$_{DDL}$ power rail pulls up the potential of the n-type well 30 through the p$^+$-type diffusion region 34. Then, the lateral bipolar junction transistor 38 is turned on to cause an emitter-to-collector current from the V$_{DDL}$ power rail to the V$_{SS}$ power rail and thus slow down the voltage-rising of the power supply V$_{DDL}$ at the V$_{DDL}$ power rail. Moreover, the pMOS transistor 70 is utilized to block the V$_{DDH}$ power rail from connecting to the contact region 26 of the CMOS circuitry when V$_{DDH}$ has a temporary potential lower than V$_{DDL}$. Thus, V$_{DDH}$ is not connected to other nwells (including nwell 20) unless when V$_{DDH}$>V$_{DDL}$ and the current flowing through the n-type well 30 is confined locally without flowing through all over the IC chip to avoid latch-up issue.

Fourth Embodiment

Figure 8:
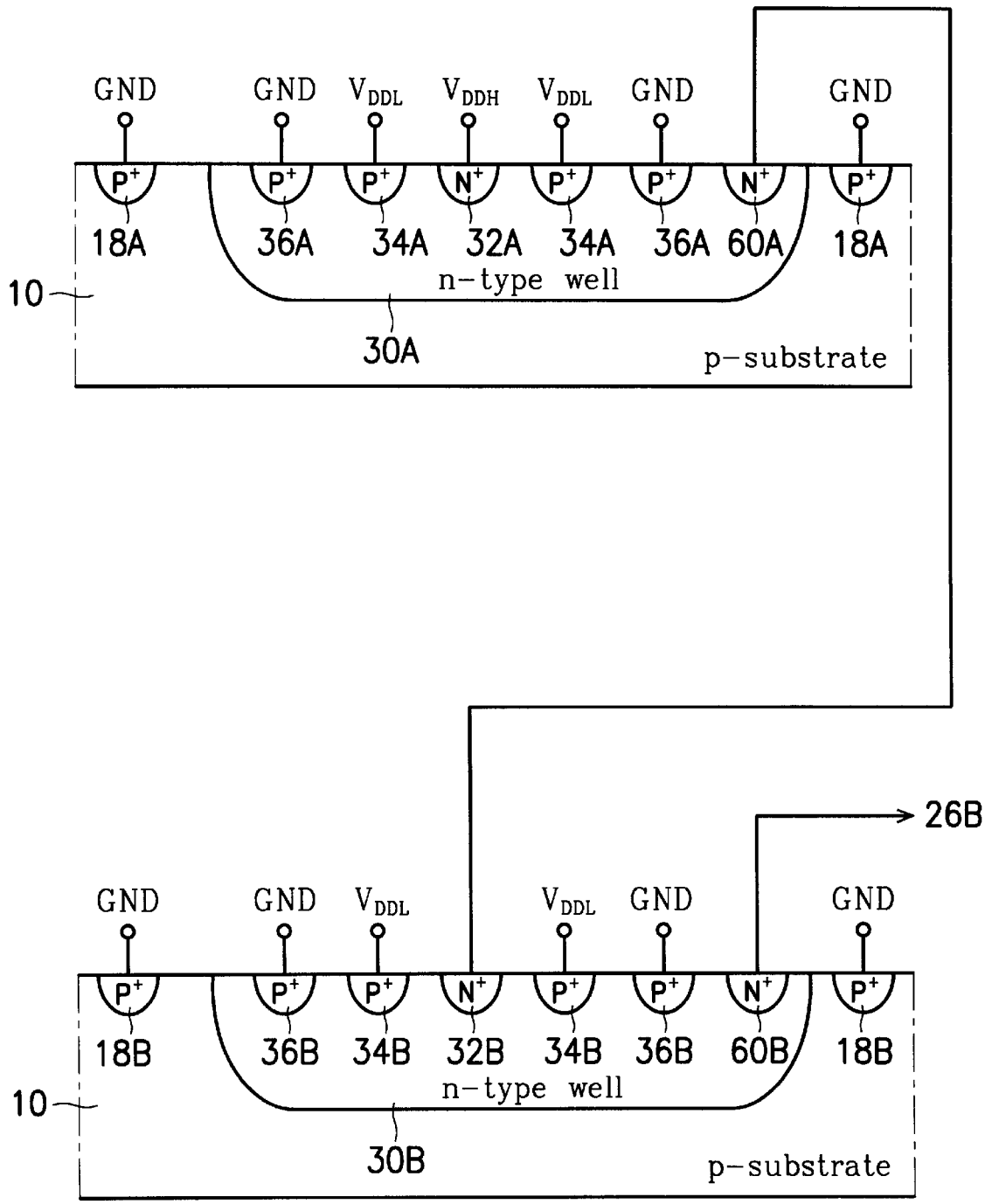
FIG. 8 schematically illustrates the fourth preferred embodiment of the present invention fabricated onto a semiconductor substrate in a cross-sectional view.

Referring to FIG. 8, the fourth preferred embodiment of the present invention fabricated onto a semiconductor substrate is schematically illustrated in a cross-sectional view, which employs two latch-up protection circuit of the second embodiment connected in series. In the drawing, letters A and B are marked behind the same reference numeral for distinctiveness.

In this embodiment, the n$^+$-type diffusion region 60A is connected to the n$^+$-type diffusion region 32B, and the n$^+$-type diffusion region 60B is connected to an nwell bus 26B, for connecting to other nwells of the CMOS circuit. The other nwells, similar to the nwel 20 of FIG. 1, connect to V$_{DDH}$ supply though the nwells 30B and 30A. If during powering up, V$_{DD}$H=1V and V$_{DDL}$=3.3V, then the nwell 30A can be at, say, 1.8V, and the nwell 30B can be at, say, 2.6V, due to the voltage pinning effect of the P+(V$_{DD}$L)/nwell diode in forward bias. The nwell bus 26B potential of 2.6V has much less chance to cause multiple-supply latch up issue in other nwells, as compared to V$_{DDH}$ of 1V connected to other nwells directly.

Fifth Embodiment

Figure 9:
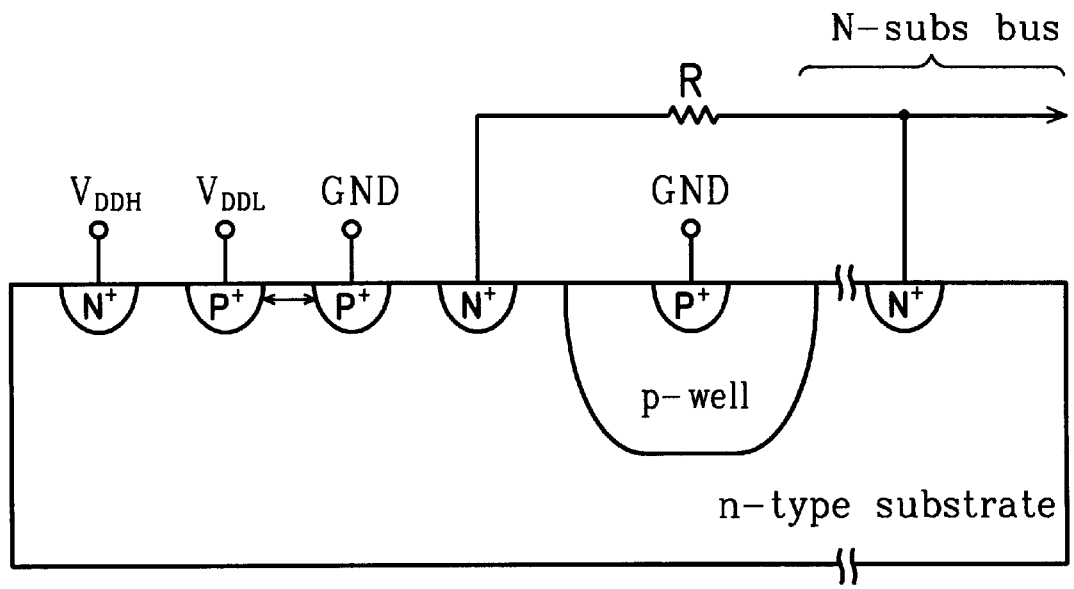
FIGS. 9~11 schematically illustrates the fifth preferred embodiments of the present invention fabricated onto a semiconductor substrate in a cross-sectional view.
Figure 10:
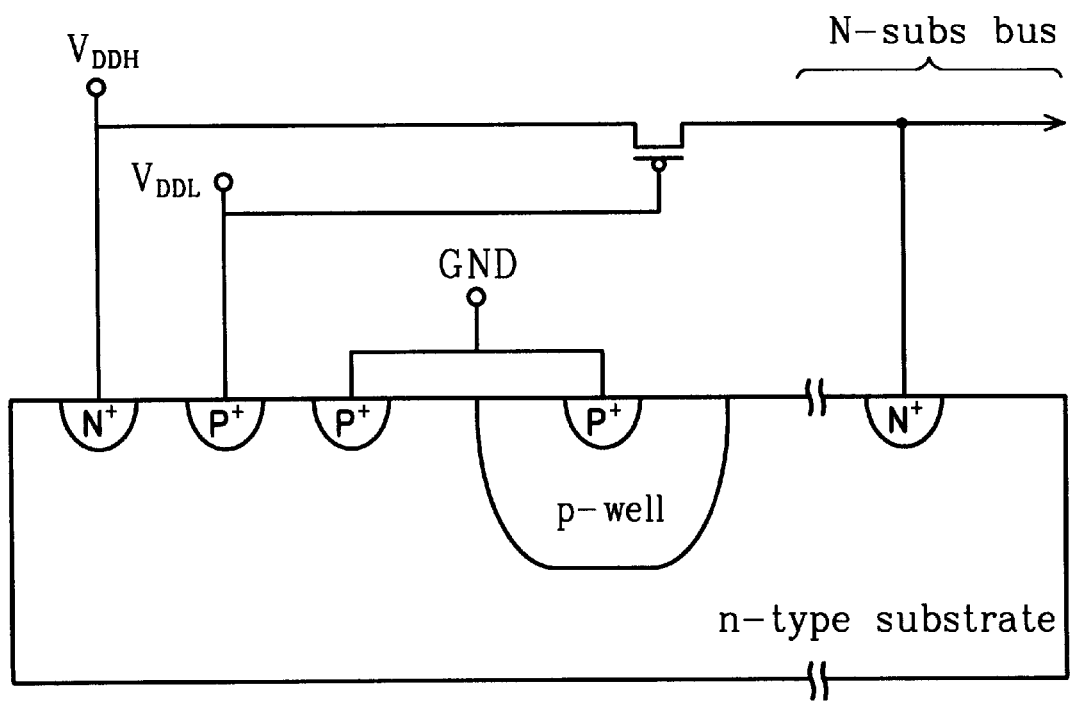
Figure 11:
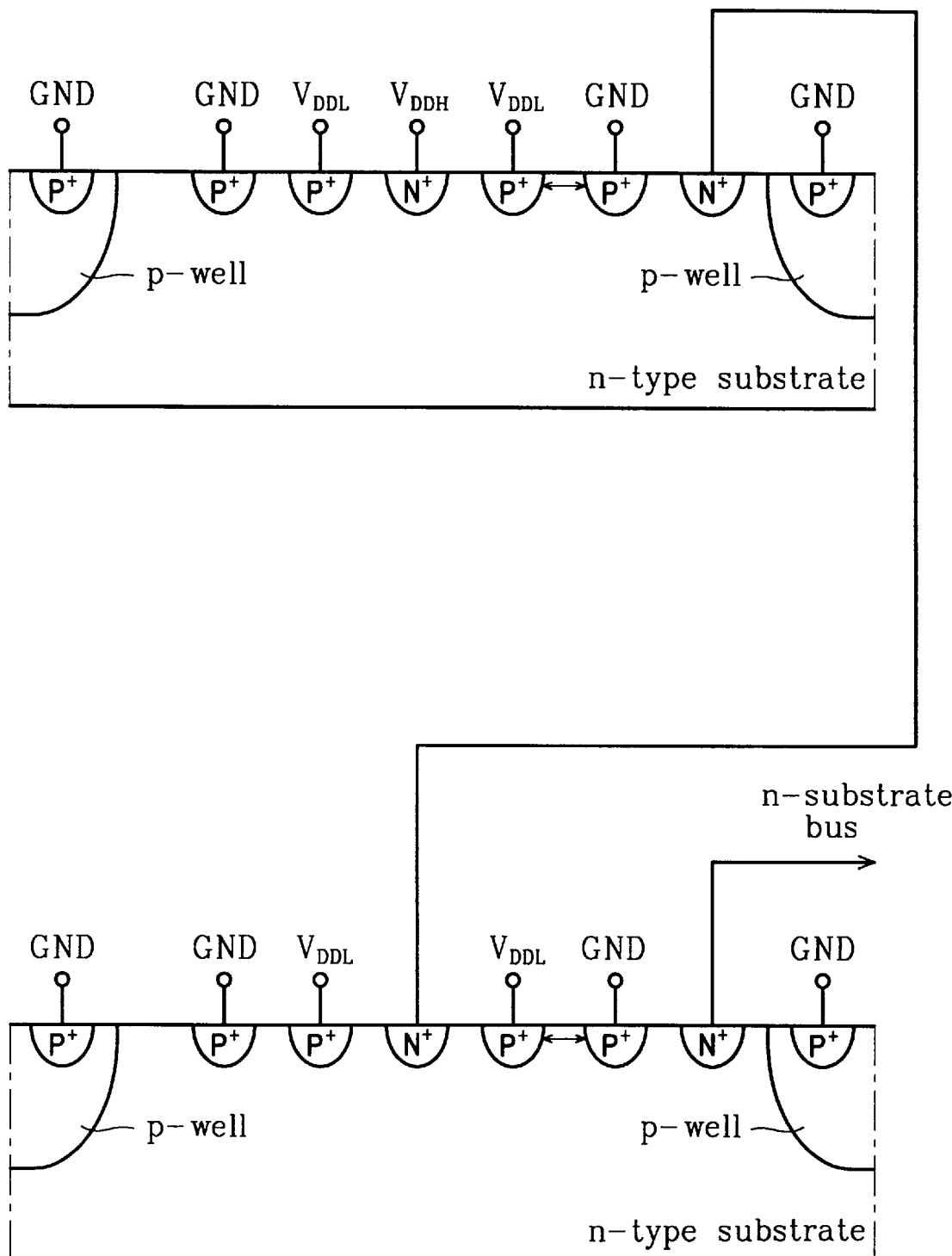

In the aforementioned embodiments, the p-type substrate 10 is exemplified so that the latch-up protection circuit is fabricated in the n-type well 30, 30A or 30B. However, if the n-substrate/p-well is utilized, the latch-up protection circuits of FIGS. 6~8 should be modified to those as shown in FIGS. 9~11, respectively.

Sixth Embodiment

If the latch-up protection circuits of FIGS. 3~11 are applied to V$_{SS1}$/V$_{SS2}$, such as the combination of −5V/−3.3V, the p-type should be changed to n-type, and n-type should be changed to p-type. Furthermore, the V$_{SS1}$ power rail is electrically coupled to the diffusion region 32, 32A or 32B, and the V$_{SS2}$ power rail is electrically coupled to the diffusion region 34, 34A or 34B.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A latch-up protection circuit integrated with a CMOS circuitry on a semiconductor substrate, the CMOS circuitry being powered by a first voltage and a second voltage via a first power rail and a second power rail, respectively, where full levels at the first power rail and the second power rail ensure that no latch-up triggering path exists in the CMOS circuitry during steady state; the latch-up protection circuit comprising:

a well of a first conductivity type formed in the semiconductor substrate to establish a junction therebetween;

a first diffusion region of the first conductivity type formed in the well and connected to the first power rail;

a second diffusion region of a second conductivity type formed in the well and connected to the second power rail, the second diffusion region being spaced from the junction by a first spacing; and a third diffusion region of the second conductivity type formed in the well and connected to a third power rail, the third diffusion region being spaced from the second diffusion region by a second spacing smaller than the first spacing;

wherein a current is generated between the second diffusion region and the third diffusion region to reduce a potential difference between the first power rail and the second power rail when the first power rail has a temporary potential within those of the second power rail and the third power rail during a power-on sequence.

2. The latch-up protection circuit as claimed in claim 1, wherein the third power rail is a ground rail.

3. The latch-up protection circuit as claimed in claim 1, wherein the second diffusion region is deposed between the first diffusion region and the third diffusion region.

4. The latch-up protection circuit as claimed in claim 3, wherein the second diffusion region is in the shape of plural strips.

5. The latch-up protection circuit as claimed in claim 4, wherein the strips are in symmetry with said first diffusion region.

6. The latch-up protection circuit as claimed in claim 3, wherein the second diffusion region is in the shape of a ring.

7. The latch-up protection circuit as claimed in claim 6, wherein the second diffusion region encloses the first diffusion region in symmetry.

8. The latch-up protection circuit as claimed in claim 1, further comprising a guard ring of the second conductivity type formed in the semiconductor substrate and deposed between the well and the CMOS circuitry.

9. The latch-up protection circuit as claimed in claim 1, wherein the first conductivity type is n-type and the second conductivity type is p-type.

10. The latch-up protection circuit as claimed in claim 9, wherein the second voltage provides a positive potential.

11. The latch-up protection circuit as claimed in claim 1, wherein the first conductivity type is p-type and the second conductivity type is n-type.

12. The latch-up protection circuit as claimed in claim 11, wherein the second voltage provides a negative potential.

13. The latch-up protection circuit as claimed in claim 1, $X<0.6Y$, where X denotes the second spacing and Y denotes the first spacing.

14. The latch-up protection circuit as claimed in claim 1, wherein the second spacing approximates a minimum feature size defined by a design rule.

15. The latch-up protection circuit as claimed in claim 14, $X \leq 2L$, where X denotes the second spacing and L denotes the minimum feature size.

16. The latch-up protection circuit as claimed in claim 1, further comprising a fourth diffusion region of the first conductivity type formed in the well and electrically coupled to a contact region of the CMOS circuitry.

17. The latch-up protection circuit as claimed in claim 16, further comprising a current-limiting device connected between the fourth diffusion region and the contact region of the CMOS circuitry.

18. The latch-up protection circuit as claimed in claim 17, wherein the current-limiting device is a resistor.

19. The latch-up protection circuit as claimed in claim 17, wherein the current-limiting device is an MOSFET transistor.

20. The latch-up protection circuit as claimed in claim 1, further comprising a transistor configured with one source/drain connected to the first power rail and another source/drain connected to a contact region of the CMOS circuitry.

21. The latch-up protection circuit as claimed in claim 20, wherein the transistor is configured with a gate connected to the second power rail.

22. A latch-up protection circuit integrated with a CMOS circuitry on a semiconductor substrate of a first conductivity type, the CMOS circuitry being powered by a first voltage and a second voltage via a first power rail and a second power rail, respectively, wherein full levels at the first power rail and the second power rail ensure that no latch-up triggering path exists in the CMOS circuitry; the latch-up protection circuit comprising:

a first diffusion region of the first conductivity type formed in the substrate and connected to the first power rail;

a second diffusion region of a second conductivity type formed in the substrate and connected to the second power rail; and a third diffusion region of the second conductivity type formed in the substrate and connected to a third power rail;

wherein a current is generated between the second diffusion region and the third diffusion region to reduce a potential difference between the first power rail and the second power rail when the first power rail has a temporary potential within those of the second power rail and the third power rail during a power-on sequence.

23. The latch-up protection circuit as claimed in claim 22, wherein the third power rail is a ground rail.

24. The latch-up protection circuit as claimed in claim 22, wherein the second diffusion region is deposed between the first diffusion region and the third diffusion region.

25. The latch-up protection circuit as claimed in claim 24, wherein the second diffusion region is in the shape of plural strips.

26. The latch-up protection circuit as claimed in claim 25, wherein the strips are in symmetry with said first diffusion region.

27. The latch-up protection circuit as claimed in claim 24, wherein the second diffusion region is in the shape of a ring.

28. The latch-up protection circuit as claimed in claim 27, wherein the second diffusion region encloses the first diffusion region in symmetry.

29. The latch-up protection circuit as claimed in claim 22, further comprising a guard ring of the second conductivity type formed in the substrate and proximal to the CMOS circuitry.

30. The latch-up protection circuit as claimed in claim 22, wherein the first conductivity type is n-type and the second conductivity type is p-type.

31. The latch-up protection circuit as claimed in claim 30, wherein the second voltage provides a positive potential.

32. The latch-up protection circuit as claimed in claim 22, wherein the first conductivity type is p-type and the second conductivity type is n-type.

33. The latch-up protection circuit as claimed in claim 32, wherein the second voltage provides a negative potential.

34. The latch-up protection circuit as claimed in claim 22, further comprising a fourth diffusion region of the first conductivity type formed in the substrate and electrically coupled to a contact region of the CMOS circuitry.

35. The latch-up protection circuit as claimed in claim 34, further comprising a current-limiting device connected between the fourth diffusion region and the contact region of the CMOS circuitry.

36. The latch-up protection circuit as claimed in claim 35, wherein the current-limiting device is a resistor.

37. The latch-up protection circuit as claimed in claim 35, wherein the current-limiting device is an MOSFET transistor.

38. The latch-up protection circuit as claimed in claim 22, wherein the second diffusion is spaced from the third diffusion region by a spacing approximating a minimum feature size defined by a design rule.

39. The latch-up protection circuit as claimed in claim 38, $X \leq 2L$, where X denotes the spacing and L denotes the minimum feature size.

40. The latch-up protection circuit as claimed in claim 22, further comprising a transistor configured with one source/drain connected to the first power rail and another source/drain connected to a contact region of the CMOS circuitry.

41. The latch-up protection circuit as claimed in claim 40, wherein the transistor is configured with a gate connected to the second power rail.

* * * * *